United States Patent [19]

Knowles et al.

[11] Patent Number: 4,724,322
[45] Date of Patent: Feb. 9, 1988

[54] METHOD FOR NON-CONTACT XYZ POSITION SENSING

[75] Inventors: James L. Knowles, Pleasanton; Jan E. G. Pantzar, deceased, late of Mountain View; by P. J. C. Lindfors, administrator, San Francisco, all of Calif.

[73] Assignee: Applied Materials, Inc., Santa Clara, Calif.

[21] Appl. No.: 835,397

[22] Filed: Mar. 3, 1986

[51] Int. Cl.$^4$ ............................................. G01B 11/14
[52] U.S. Cl. .................................... 250/341; 250/340; 250/358.1; 250/360.1
[58] Field of Search ...................... 250/341, 340, 360.1, 250/359.1, 358.1, 572, 571; 356/371

[56] References Cited

U.S. PATENT DOCUMENTS 3,206,603 9/1965 Mauro ................................. 250/341

FOREIGN PATENT DOCUMENTS 1394112 5/1975 United Kingdom ................ 250/572

Primary Examiner—Janice A. Howell
Assistant Examiner—Constantine Hannaher
Attorney, Agent, or Firm—Flehr, Hohbach, Test, Albritton & Herbert

[57] ABSTRACT

A method for detecting and precisely locating features such as susceptor surfaces, wafers and surface depressions and elevations, is disclosed. A modified high angle, infrared, crossed-optics-pair sensor unit is used, as well as both perpendicular and parallel scanning.

9 Claims, 11 Drawing Figures

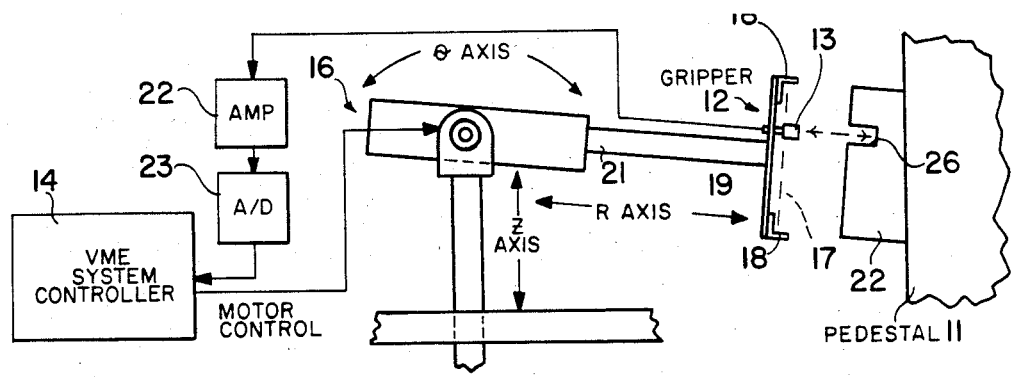
FIG. 1
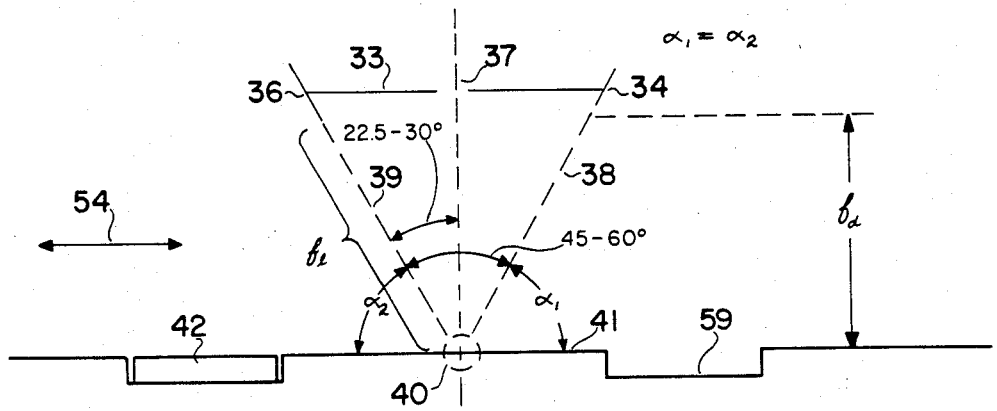
FIG. 2
FIG. 3
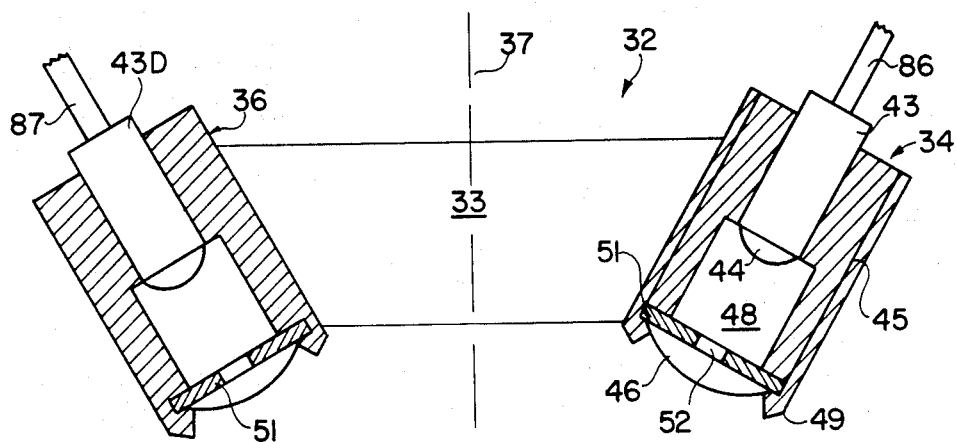

4,724,322

METHOD FOR NON-CONTACT XYZ POSITION SENSING

BACKGROUND OF THE INVENTION

This invention relates to position sensing and in, particular, to apparatus and methods for effecting precise, non-contact, three-coordinate position sensing suitable, e.g., for use in robotic-type semiconductor wafer handling.

Semiconductor wafer processing equipment such as deposition reactors and etchers increasingly require automatic position sensing systems to locate targets such as wafer-holding susceptors and pedestals. Automatic position sensing is very useful, particularly where the targets may be moved or have unpredictable position changes, for example, as the result of high temperature cycling during the associated processing sequence. Typically such systems are used to determine the distance between the sensor and the sensed object at several points on the object by directing a beam of electromatic radiation at a near normal angle of incidence onto the sensed surface for reflection and detection by an associated detection circuit.

As an example, commonly assigned co-pending U.S. Ser. No. 693,722, entitled SEMICODUCTOR PROCESSING SYSTEM WITH ROBOTIC AUTO LOADER AND LOAD LOCK, filed Jan. 22, 1985, in the name of DAN MAYDAN ET AL, discloses a concurrently developed, state-of-the-art, non-contact, adaptive optical sensing system which is part of the robotic wafer handling system 10 shown schematically in FIG. 1. The Maydan et al application is incorporated herein by reference. This Maydan sensing system is used to detect and map the position of a wafer-mounting electrode or pedestal 11 relative to a robotic wafer gripper 12. In the system 10, a sensor 13 is used to determine the gripper 12-to-pedestal 11 distance at several points along the pedestal, under the control of computer 14. The computer is a VME (Versa Modular European) system controller which utilizes the position information to calculate the angular orientation and the position of the pedestal 11 relative to robot 16.

The automated wafer handling system or autoloader 10 automatically loads and unloads wafers 17 from the pedestal 11 in a processing system such as an ion-assisted plasma etching chamber. A plurality of gripping elements 18 are reciprocally movable in radial directions along transparent circular base 19 of the gripper 12 to cooperatively grip and release the wafers 17 for loading and unloading. The optical sensor 13 is mounted behind and/or to the side of the gripper base 19. The wafer gripper 12 is itself mounted on the robot 16 for (R, Z, $\theta$) movement. That is, the gripper head 12 is mounted on robot arm 21 which is reciprocally movable along the R axis. The robot itself is reciprocally movable along Z and $\theta$ axes. R, Z and $\theta$ movement is effected by stepper motors (not shown) which are controlled by the system VME controller 14.

The wafer gripper sensor unit 13 transmits a focused IR beam at an angle of about 90° (i.e., normal incidence) onto the pedestals 11 and detects the resultant reflected beam and transmits a resultant amplified, digitized electrical signal which contains information representing the distance between the sensor unit 13 and the pedestal 11. That is, the output signal from the sensor unit 13 is applied to amplfiier 22 and to analog/digital converter 23, then transmitted to the controller 14 for use in calculating the pedestal orientation and position and, ultimately, for use in controlling the three (R, $\theta$, Z) robot stepper motors.

One approach which takes advantage of the small focal spot size and sensitivity of sensor unit 13 involves determining the sensor 13-to-pedestal 11 distance at two points on the pedestal and applying triangulation techniques to calculate the precise angle of inclination and the associated wafer gripper travel distance for the pedestal.

In a preferred embodiment, the sensor unit 13 is the HP (Hewlett Packard) HEDS-1,000 High Resolution Optical Reflective Sensor. The optical spot (700 nm wavelength) is focused to a very small spot diameter of about 0.2 mm at 4.5 mm from the detector window. This detector was originally designed for bar code scanner readers. Because of its sensitivity to the actual distance (R axis distance), it has proven very useful for position sensing and determination.

However, it has been found that the very small focal spot size provided by the sensor 13, which advantageously permits precise determination of the gripper-to-pedestal distances, precludes use of the sensor in a parallel scanning mode, for example, to detect the location of articles such as pedestals on the wafers. The point focus of the sensor would cause the scanning sensor to constantly shift in and out of focus with the result that the electrical output would be obscured by noise.

SUMMARY OF THE INVENTION

As suggested by the above summary of the advantages and disadvantages of small focal spot size sensor systems, it is an object of the present invention to provide a non-contact approach for position sensing in which the position information can be developed by scanning the sensor parallel to the detector surface as well as normal to that surface.

It is a particular object to provide such a dual mode non-contact scanning approach which is useful for precisely detecting and determining the position of a semiconductor wafer mounting surface such as a susceptor or electrode or the like.

It is another approach to provide such a non-contact sensing approach which is readily adaptable to robotic-type automated wafer/article handling systems. In one aspect, the present invention relates to a method for detecting essentially specularly reflecting and partially specularly reflecting, partially diffuse regions or components of a surface, the steps comprising: (1) mounting an infrared beam emitter having a focal length and an infrared beam detector having a focal length along respective output beam and input beam axes oriented at an angle of about 45°-90° therebetween and spaced apart a distance selected to provide coincident emitter and detector foci; (2) confining the output beam at the emitter and the input beam at the detector to a relatively small diameter; (3) positioning the emitter and detector at differnt angles relative to the normal to the surface; and (4) scanning the sensor unit along the surface at the focal distance therefrom to provide reflected emitter beam intensity levels at the detector representative of substantially purely specular reflection, partially specularly reflection and elevations and depressions in the surface.

In a second aspect, the present invention relates to a method for detecting the distance between a crossed optics pair sensor unit and a partially specularly reflecting surface, the steps comprising: (1) mounting an infrared beam emitter having a focal length and an infrared beam detector having a focal length along respective output beam and input beam axes oriented at an angle of about 45°–90° therebetween and spaced apart a distance selected to provide coincident emitter and detector foci; (2) confining the output beam at the emitter and the input beam at the detector to a relatively small diameter; (3) positioning the emitter-detector axis at a small angle relative to the normal to the surface; and (4) scanning the detector along an axis substantially perpendicular to the surface and through the focal distance of the unit to provide relfected emitter beam intensity levels at the detector representative of the distance between the detector and the surface.

DETAILED DESCRIPTION OF THE INVENTION

Figure 4:
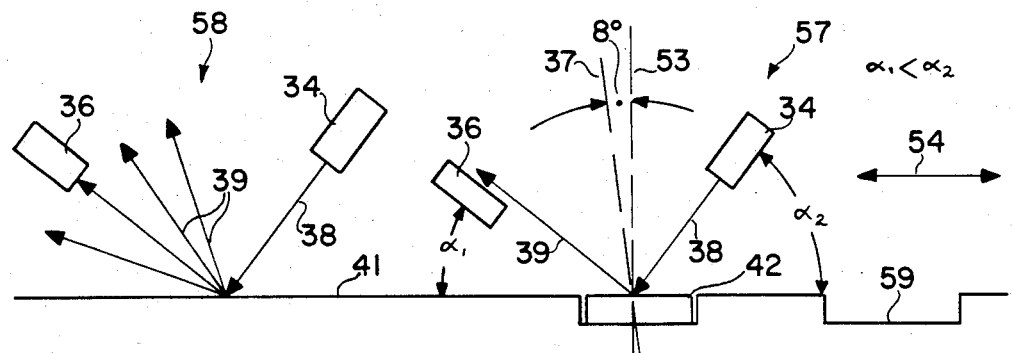

As mentioned previously, the sensor 10, FIG. 1, has very accurate location sensing and determination capabilities due to its very small beam spot size or diameter of about 0.2 mm and its shallow focus. The only known disadvantage associated with this sensor unit was discovered when the sensor was scanned parallel to wafer holding susceptor surfaces, which characteristically are rough. In parallel mode scanning, the sensor beam rapidly moves in and out of focus, creating noise in the associated electrical detection circuit which masks the true focus-related information.

In the course of investigating the possibility of achieving precise dual mode perpendicular and parallel scanning in a single sensor system, it was discovered that large angle, crossed optics pair (COP) sensors which are used in applications such as reflective object sensing, have the potential for parallel scanning operation. As used here, "large angle crossed optics pair" refers to emitter and detector units oriented with a relatively large angle therebetween such as 45°–90°, in contrast to the small angle used in sensor units such as 13, FIG. 1.

Referring to FIGS. 2 and 3, the large angle crossed optics pair (COP) sensor unit 32 used in the present invention comprises a frame cross piece 33 which mounts an IR (infrared) beam emitter 34 on one side and an IR detector 36 on the opposite side. As mentioned, the emitter 34 and detector 36 are both mounted at relatively large equal angles of, e.g., 22 ½ to 30° relative to the COP axis 37. The length of the frame 33 is selected so that the emitter and detector beam axes 38 and 39 intersect at the common focal distance, $f_d$, (FIG. 2). The associated angular orientation of 45° to 60° between the emitter and detector can readily be increased to 90° and would provide even better resolution, but the smaller angles provide still adequate resolution and a shorter cross piece 33 and, thus, a relatively lightweight sensor unit.

As shown schematically in FIG. 2, the large angle, relatively large diameter COP beams 38 and 39 are defocused to provide a relatively large focal area or "focus" 40 for the beams. The large focal area typically is centered about one inch from the emitter or detector measured along the optical axis, and is much less susceptible to noise than is the short focus of the sensor 13.

However, despite this potential advantage of the high angle COP sensor 32, during attempts to use sensor 32 for the sensing of wafers and supporting susceptors, the sensor did not provide a sufficient signal differentiation to distinguish between susceptor surface 41 and wafer surface 42 during parallel scanning. It was discovered that such high angle COP sensors were suceptible to reflected energy from the partially specularly reflective (i.e, partially diffuse reflecting) susceptor surface 41. That is, the partially specularly reflective susceptor 41 and the essentially entirely specularly reflective wafer(s) 42 both provided relatively high energy levels of reflection onto the detector 34 and, thus, similar detector output signals which made differentiation difficult.

This susceptibility to reflected energy was eliminated by incorporating relatively small diameter orficies into the emitter 34 and the detector 36 and by rotating the axis of 37 of the COP sensor unit 32 slightly relative to the normal susceptor surface. Referring to the schematized cross section shown in FIG. 3, the preferred emitter shown there is the Banner PT 400 HF unit comprising an IR beam emitter 43 with standard lens 44, and housing 45 which mounts a second lens 46 at the front end of cavity 48. Retainer 49 mounts lens 46. The primary modification made to the sensor is the addition of an annular opaque washer 51 which has a central circular orifice 52 about 5 mm in diameter. Light originating at the emitter 43 is collimated by the lens 44, traverses cavity 48, and is sized by the orifice 52 to a corresponding diameter of about 5 mm, then is focused by the lens 46 at a distance $f_d$ of about 25 mm measured along the optical axis. Detector 36 is similar to emitter 34, including the addition of the apertured washer 51, except that an IR beam detector unit 43D is used. The presently preferred detector is the PT 400 LR.

Please note, the down-sized, 5 mm aperture is given by way of a preferred example and not limitation. The important feature is the recognition that a small aperture is necessary. Those of skill in the art will readily determine useful small aperture sizes for different sensor units and systems.

Referring to FIG. 4, in addition to the sized orifice 52 (FIG. 3), the axis 37 of the COP unit 32 is rotated typically about 8° from the normal 53 to the susceptor surface so that the angle of incidence formed by the emitter with the surface differs by about 8° from the angle of reflection associated with the new detector orientation. Along with the use of the sized orifice, rotating the COP angle 8° off the normal 53 eliminates spurious detection of partially specularly reflective surfaces. As a result, when the sensing unit 32 is scanned parallel to a susceptor such as 41 (as indicated by the arrow 54) at the defocused focal distance, the unit can be used to detect both the susceptor 41 and the wafer 42. (Please note, the focal distance is the distance, $f_d$, between the emitter (or the detector) and the surface such as 41 for which the diamond focus 40 of unit 32 is centered on the surface.)

First, regarding the wafer 42, the essentially entirely specular reflections from the wafers 42 are not intercepted by the COP detector 36. Conventionally, as shown in FIG. 2, the emitter 34 and detector 36 would be oriented at equal angles, $\alpha_1$ and $\alpha_2$, relative to the investigated surface 41. Thus, the angle of incidence of the emitter, $\alpha_1$, equals the angle of reflections received by the detector, $\alpha_2$. As a consequence, specular reflections from both partially specularly reflecting surfaces 42 as well as purely specularly reflecting surfaces 41 provide similarly significant detection and detector output levels.

According to the present invention, in contrast, the emitter and detector orifices are reduced to provide more precise energy detection and thereby decrease a spurious detection of IR energy. In addition, the angle of orientation, $\alpha_1$, of the emitter 34 is larger than the angle of orientation of the detector to the investigated surface, $\alpha_2$, so that the necessary condition $\alpha_1 = \alpha_2$ for detection of specular reflections is not satisfied. Thus, specularly reflected energy is not detected and there is essentially no detector output signal as the beam traverse the specular wafer surface 42. This situation is illustrated schematically at 57, FIG. 4.

Secondly, regarding the partially specularly reflective susceptor 41, although the detector 36 is offset from the line of sight of a specularly reflected beam from the emitter, the reflected energy associated with its diffuse reflection is intercepted by the detector unit 36 and thereby provides a detector output signal. This situation is illustrated schematically at 58, FIG. 4.

The different signal levels associated with the partially specularly reflected susceptor and the entirely specularly reflective wafer permit detection of the susceptor and wafer. As the COP sensor unit 32 is scanned parallel to the susceptor, a detector output signal indicates that the emitted beam is traversing the susceptor surface 41. Then the signal drops to substantially zero as the beam crosses onto a wafer 42, and returns to a relatively high level as the beam crosses back into the susceptor 41 on the other side of the wafer 42.

In addition, the depth of the common overlapping defocused focal area 40 of the COP emitter 34 and detector 36 provides different detector output signal levels at the susceptor surface 41 and at an empty susceptor pocket, such as 59, FIG. 4. This permits detection of the pocket and its depth. This is so because, with the beam focused on the susceptor surface 41, the overlap between the foci of the emitter and detector is at a maximum. The maximum overlap between the detector's field of view, and the emitter's field of view causes the detector absorption of the emitter energy to be at a maximum and provides a detector output signal. In contrast, as the beam traverses the pocket 59, the decreased overlap of the emitter and detector foci (or the complete lack of overlap if the pocket is more than a few mm deep) results in the detector receiving a smaller percentage of the emitted energy and provides a diminished detector output signal.

Stated differently, when the beam is traversing the susceptor surface 41, the emitted energy is concentrated at a minimum-sized focal area which is substantially coincident with the detector's focal area, whereas during the traverse of the empty susceptor pocket 59, the detector receives only a portion, if any, of the emitter energy.

As mentioned, using the exemplary system 32, the peak detector signal occurs for $f_d \sim 25$ mm or 1 in. The large focal area 40 provides a generally bell-shaped Gaussian detector output with the peak at $f_d \sim 1$ in and extending $\sim 0.15$ in on each side. That is, output signal intensity if a varying function of z distance over $f_d \pm 0.15$ in.

The use of a COP sensor unit 32 having a sized orifice and which is oriented off normal permits (1) the use of parallel scanning to determine the presence and position along the scan axis (a) of specular, diffuse and partially diffuse surfaces such as wafers and susceptors and (b) of recessed/raised surface features such as detector pockets and (2) the use of perpendicular scanning to determine the location of a surface along the scan axis.

Scanning and Detection System 80

Figure 5:
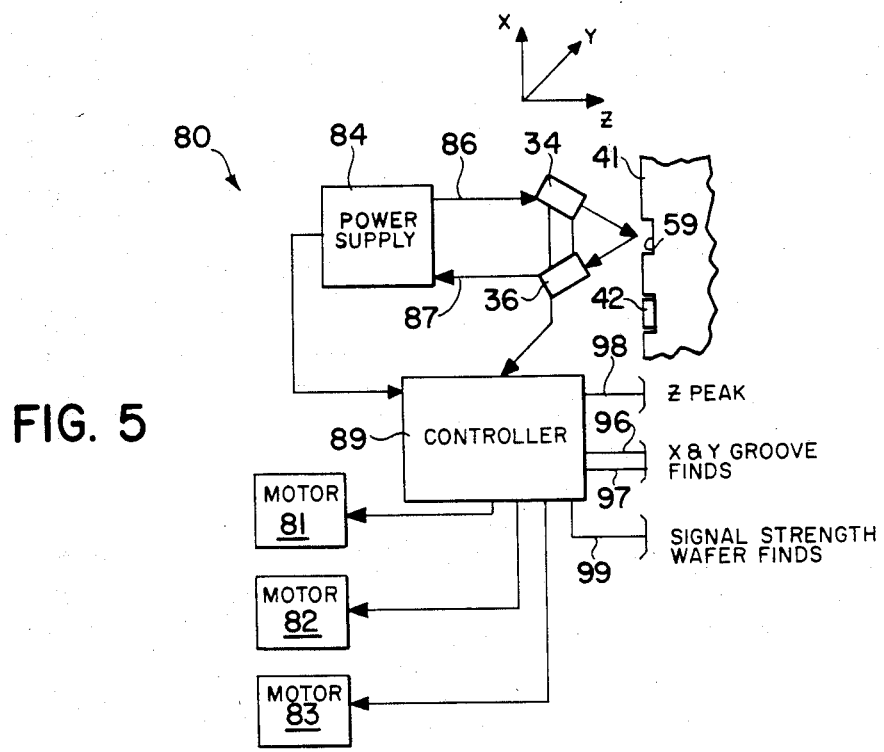

FIG. 5 schematically illustrates a preferred embodiment 80 of a computer controlled scanning and detection system. Sensor unit 32 (FIG. 3) can be mounted on a robot arm or a translation stage, etc., and driven in x, y, z coordinates by stepper motors 81, 82, 83. A power supply and detector unit 84 is connected to the emitter 34 and the detector 36 via lines 86 and 87. In the illustrated embodiment, the power supply and detector unit is an integrated module 84 such as the Banner model TM2. This module supplies power at 20 kHz (Kilohertz) over the input line 86 to the emitter unit 34. In turn, the 20 kHz output signal from the detector unit 36 is supplied over line 87 to the module 84 and the resulting detector analog output signal is supplied over line 88 as input to a dedicated microprocessor or computer 89 such as, for example, the IBM PC.

The computer 89 operates on the input signal and provides control signals for starting and stopping the x, y, z-stepper motors 81, 82, 83. The computer 89 also provides output signals over lines such as 96, 97 which contain x and y coordinates information such as the x and y susceptor pocket locations or "finds" and over line 98 regarding the z-axis peak focal point or z "find". The computer can also provide an output signal over line 99, based upon the strength of the detector signal received via input line 88, which represents the presence/absence of a wafer on the susceptor. This various detection and position information concerning features such as the susceptor wafer pockets 59 and wafers 42 is stored in computer memory and used to effect precision robotic wafer handling, i.e., wafer loading and unloading at the susceptor.

The precise positioning of the sensor unit 32 and the feedback regarding the sensor unit position are provided by stepper motor control circuits, which can also be used to drive the robotic wafer handling apparatus itself. Because various such circuits are conventional, an exemplary embodiment need be described only briefly. In one such embodiment, and referring to FIG. 6, the computer 89 is interfaced by address and data buses 101 to a step motor controller circuit 102 and an encoder counter (up/down counter) 103. Responsive to motor control commands from the computer 89, the step motor controller 102 provides a train of four-phase motor clock and direction drive signals via counter 103 to the bipolar chopper circuit 104, which provides power signals to the windings of the reversible step motors to control the operation, including the direction of the individual motors. In the illustrated embodiment (FIG. 5), three step motors 81, 82, 83 are used: one each to control x, y and z direction sensor movement. Commercially available digital shaft encoders 106—specifically, quadrature optical encoders—provide direction and clock signals to an encoder buffer board 107 which "squares" the waveform of the signals from the encoders for input to the encoder counter 103 for use in controlling the step motor operation. The direction signals are used by the encoder counter 103 to decrement or increment the count.

Figure 6:
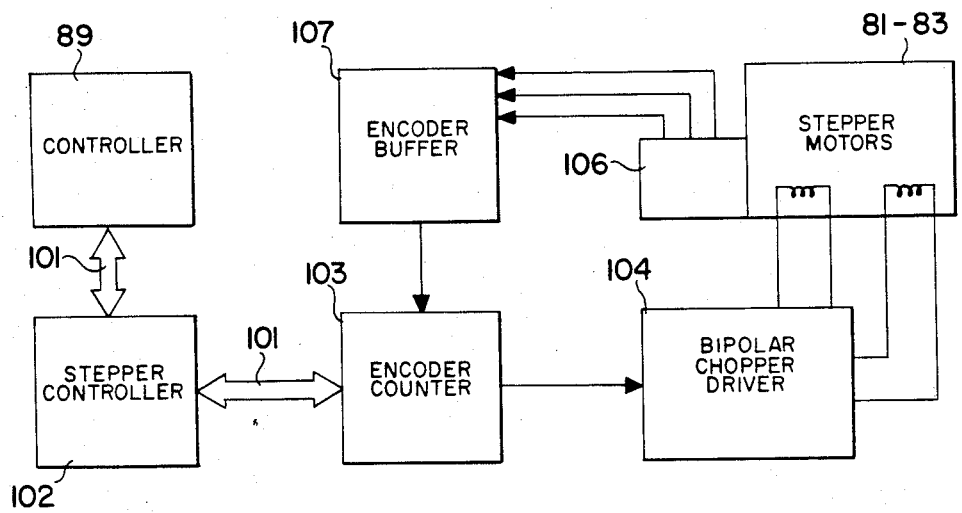

In short, a stepper motor control circuit such as that shown in FIG. 6 drives the stepper motors 81-83 under control of the computer 89 and a particular operational program and provides, as feedback, count information which itself is used to position the motors and associated sensor unit and to monitor the position thereof.

This system is described in the above-mentioned copending Maydan application.

Surface Finding and Detection

As used here, the meaning of "detection" includes to discover or discern the presence of a surface, specifically a wafer or susceptor or other surface feature. Also, "find" or "finding" includes the process, or aspects, of determining the location or distance of a wafer, susceptor or other surface feature.

Three algorithmic approaches are discussed below to illustrate the versatile capability of the modified IR sensor unit 32 and the detection circuit 80. The first two approaches use z-direction or perpendicular scanning, whereas the third uses parallel or x, y scanning.

The fist algorithm interpolates the midpoint associated with the location of the peak signal (and the focal distance, $f_d$, FIG. 2) based upon two points of equal signal intensity on opposite sides of the peak.

The second algorithm determines the positive and negative slopes of the signal curve and extrapolates the two slopes to obtain the location of the peak signal and the associated focal distance. The third algorithm uses the signal variation which occurs in scanning the opposite edges of a wafer pocket to define the location of the pocket.

The characteristics or determinative output signal for the two z-scan algorithms is the peak signal, whereas the onset and end of the trough or minimum signal associated with the wafer pocket is the characteristic or determinative output signal for the parallel scan algorithm. In each of these three cases—indeed in all cases of finding or detection—it is helpful to define a position(s) of the characteristic signal(s) relative to a coordinate reference point which is known to the computer. Typically, this is done by counting the stepper motor steps between the reference point and the sensor unit locus associated with the particular characteristic signal.

1. Z-Find Interpolation

One purpose in determining when the sensor unit 32 is positioned at the focal distance, $f_d$, from the susceptor surface 41 is to precisely determine the distance along the z-axis between the susceptor and a reference location. In turn, as discussed below, this z-axis distance is one of three such measurements which define the plane of the susceptor.

Figure 7:
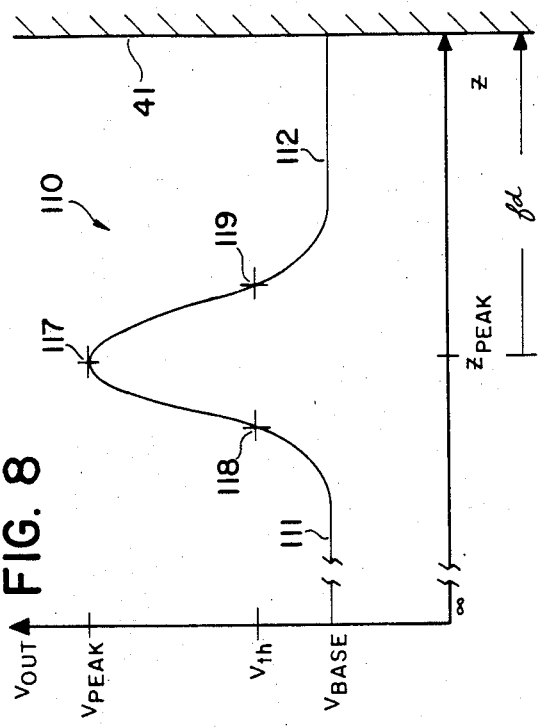

The first z-find algorithm is shown in FIG. 7, which depicts the detector output signal 110 as a function of the sensor unit 32-to-susceptor 41 distance, z, during perpendicular scanning of a partially specularly reflecting susceptor surface. This first algorithm involves scanning the sensor unit 32 along the z-axis normal to the susceptor surface 41 starting from a distance which is either well outside or well within the focal distance, $f_d$, and scanning through the focal distance. We assume a maximum voltage, $V_{peak}$, associated with the focal distance, of about 10 volts and a background voltage, $V_{base}$, due to the partially diffuse scattering characteristics of the susceptor, of about 4 volts.

During the z-find scan, two z-axis distances $z_1$ and $z_2$ associated with equal output signals of, for example, 0.5 $V_{peak}$ (5 volts) are determined on opposite sides of the curved peak 117. See points 115 and 116. Assuming symmetry, the computer 89 calculates the midpoint between $z_1$ and $z_2$, that is, $z_r=(z_1+z_2)/2$. The distance $z_r$ is the calculated location or distance of the sensor unit 32 from the preselected reference point when the sensor unit is positioned at the focal distance $f_d$ from the susceptor 41. Thus, the total distance $z_t$ between the reference point and the susceptor is, $z_t=z_r+f_d$, which is used for precisely controlling the movement of the associated automatic wafer handling apparatus during wafer loading and unloading at the susceptor.

2. Z-Find Extrapolation

Figure 8:
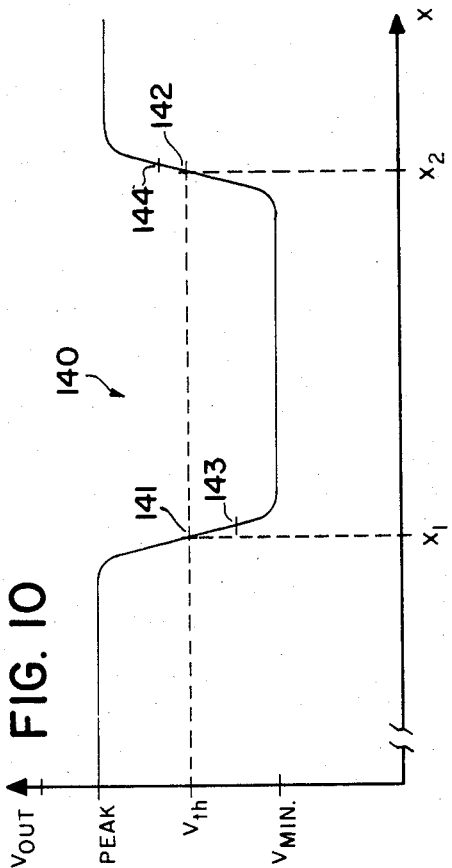

As mentioned, this z scanning method involves the calculation of a straight line slope using a least squares fit for three points on each side of the peak. This algorithm is depicted in FIG. 8, which depicts the detector output signal as a function of detector 32-to-susceptor 41 distance during z-find operation. FIG. 8 is similar to FIG. 7, with the exception that as indicated at 118 and 119, the threshold voltage $v_{th}$ is typically about 25 percent of the anticipated relative peak height. At the fixed, focal distance $f_d$ of the susceptor unit 32 from the susceptor surface, the COP detector signal curve 110 will have a maximum, $V_{peak}$. The amplitude 117 of this peak may vary widely depending on surface finish, or reflectivity, etc. For the detector base voltage $V_{base}$ of about four volts, the peak must be within the range of 5.5–10 volts, which gives a relative peak amplitude of 1.5–6 volts.

The peak 117 is found when at least two COP sensor readings are above the threshold voltage, $V_{th}$, for example, above amplitude 118 on one side of the peak. The detector voltages are then sampled periodically, for example, every eight mils (0.2 mm), until the voltage falls below the threshold level, at amplitude 119 on the opposite side of the peak 117, and are stored in the computer memory. The peak position is calculated using at least three entries on each side of the peak. More typically the number of samples used in each such z-find operation is 10–15 for a 60° COP sensor angle and 14–19 for a 45° COP angle.

Figure 9:
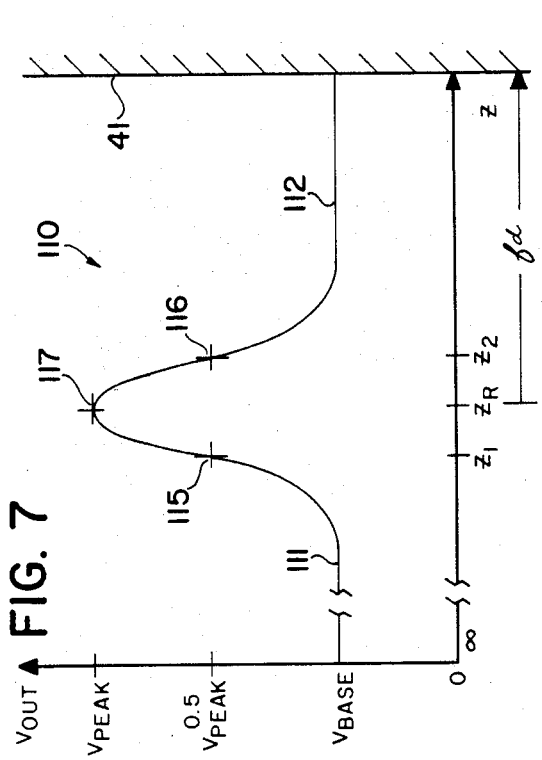

Next, as a first computer calculation, the voltage derivatives $dV/dt$ are calculated. The resulting curve 120 is shown in FIG. 9. There, sixteen exemplary calculated $dV/dt$ points 121–136 correspond to the arbitrarily designated z-axis coordinates $z_1$–$z_{16}$.

Next, the computer determines the first position associated with a negative derivative, $-dV/dt$. In this example, the position is $z_9$. Then, at least six $dV/dt$ points are selected, three each on each side of the zero crossing. The method of least squares is applied to these six data points to calculate a straight line fit 137 to the six data points. The z-axis crossing point of straight line 137 is then calculated. This crossing point $Z_{peak}$ corresponds to the detector voltage peak 117, FIG. 8.

Typically, the tabulated detector voltage of the first point, $Z_9$, after the zero crossing is saved as the peak amplitude $V_{peak}$, and can then be used for determining the next threshold level. If a particular sampling sequence does not provide six points around the peak, the peak may be resampled after selecting a new, lower threshold voltage. Also, if a peak (i.e., a detector voltage above the threshold level) is not found within a predetermined travel distance such as 15 mm, the surface z-find operation may be aborted and the detector backed out beyond the search range preparatory to restarting another z-find operation.

Also, it should be noted that the base voltage $V_{base}$ is detected based upon a selected number of consecutive detector readings and detector movements, such as three, which show the same detector output voltage (for example, when three consecutive 1 mm detector movements and readings show the same detector voltage within ±2 volts). For recalibration, the base voltage is re-established periodically, for example, after every 50 surface "finds", or after each susceptor find or at some other convenient interval.

3. Finding Reference Mark/Pocket

As mentioned above, this third algorithm uses x or y direction scanning which is parallel or substantially parallel to the investigted surface. It also uses the signal variation that occurs at the edges of a depression to define the location of the depression. Please note, the technique is equally applicable to the detection of a raised location. The exemplary application described here involves the location of a depression such as a susceptor reference mark or a wafer-holding pocket because these are the features which are currently of the most interest.

Figure 10:
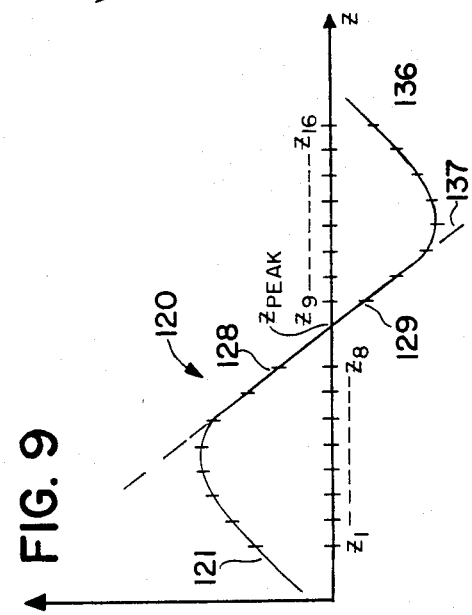

The depression such as the reference mark is found by focusing the COP sensor 32 on the surface of the susceptor 41 and scanning the sensor laterally across a possible reference mark. For example, the COP detector voltage can be sampled at 20 mil intervals. FIG. 10 depicts a representative curve 140 of the detector output signal as a function of detector 32-to-susceptor 41 distance during a reference mark finding operation. Here the threshold voltage level $v_{th}$ is typically about 50 percent of the amplitude between $V_{peak}$ and a previously determined valley/depression minimum voltage $V_{min}$ (or the base level voltage $V_{base}$ when the minimum voltage is unknown). The reference mark is then found by moving the focused sensor 32 laterally and sampling the COP detector voltage below the threshold level 141, such as at 143. The first calculated edge of the reference mark, $x_1$, is found by linearly interpolating the x coordinate position at the threshold level 141, based upon knowledge of the current and previous detector voltage and position.

The opposite end of the reference mark is found by continuing the parallel scan until a detector voltage, such as 144, is detected above the threshold voltage 142. At the same time, the minimum detector voltage $V_{min}$ associated with the particular depression is determined. The second edge of the reference mark, $x_2$, is then calculated in the same way as the first, by linear interpolation of the x position at the second threshold. Then, the center of the reference mark is calculated from the average (midpoint) of the right and left edges, i.e., from $(x_1+x_2)/2$. A new valley or minimum voltage may be calculated for the next reference mark-finding operation as the average between the previous $V_{min}$ and the new $V_{min}$. By using such a running average as the minimum voltage, any slow gain changes in the output voltage can be detected and corrected.

Overall Susceptor Location

One example of the use of the above algorithms is to precisely locate the wafer-holding pocket locations formed along susceptor faces in integrated circuit processing chambers. To do this, it is necessary to precisely locate the plane of the susceptor face and to locate pockets within the face by finding a Cartesian coordinate system that is rigid with respect to the face. Typicallly, this coordinate system is defined by reference marks which are formed in the susceptor face. Referring to the highly schematized representation 145 of a susceptor face shown in FIG. 11, one approach is to form the reference marks at the four corners of a rectangular array. One vertical and one horizontal reference mark is located at each corner. That is, vertical marks 146V through 149V are located one at each of the four corners. Horizontal marks 146H through 149H are located closely adjacent the correspondingly numbered vertical marks. (The reference marks are shown greatly enlarged for clarity.)

The plane of the susceptor 145 is then located by determining the z-axis location at each of three spaced points such as 151, 152 and 153 using either the first or the second z-find algorithms described above, then calculating the axial distance $z=0$ associated with that plane.

Figure 11:
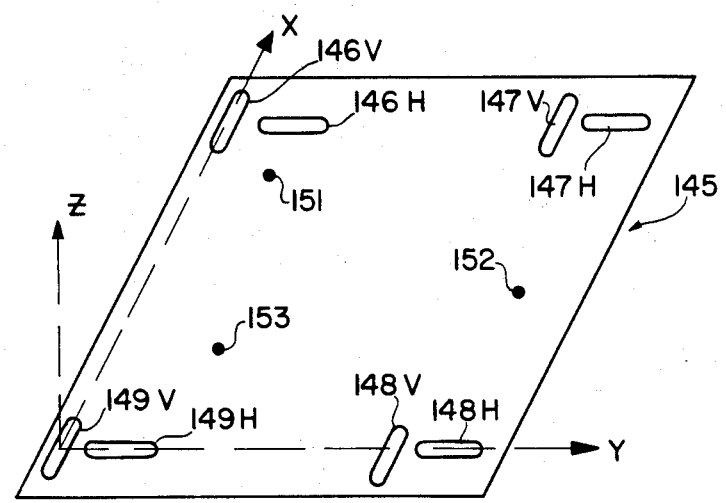

Next, the x-axis (FIG. 11) is determined using the third algorithm described above and horizontal (y-direction) scans to precisely locate the center line of the two vertical reference marks 146V and 149V (or 147V and 148V). FIG. 11 assumes the marks 146V and 149V coincide with the x-axis. Typically, however, this may not be true—the location of the center lines will provide the angular rotation of the axis through the marks 146V-149V relative to the reference x-axis.

Finally, the location of the plane is completed by using the third algorithm to implement a vertical scan of a horizontal target such as 146H or 149H to define the x-axis origin. In the case of the coordinate system defined in FIG. 11, the coordinate system origin (0,0,0) is defined at 149V,149H.

SUMMARY OF ADVANTAGES

Thus, the present invention includes a non-contact approach for detecting and precisely determining the position of a surface such as a susceptor surface relative to a known coordinate system. The approach uses a large angle crossed optics pair sensor unit (unit 32, FIG. 3) in which the emitter and detector orifices are sized to a relatively very small diameter and the sensor axis is rotated relative to the normal to the investigated surface (FIG. 4), to prevent spurious detection of specular reflection signals and to permit the detection and location of surface features based upon their specular reflection characteristics, diffuse reflection characteristics, and height (both positive and negative). That is, the sensor can be used to detect and locate diverse features such as susceptor wafer-holding pockets, wafers and reference marks, among others.

Examples of efficacious algorithms are also presented for using the large-angle crossed optics pair sensor in detection and location modes. For example, one algorithm shown in FIG. 7, involves scanning the COP sensor unit 32 along the z-axis perpendicular to the investigated surface and interpolating the midpoint associated with the peak signal and the focal distance from two points of equal signal intensity located on opposite sides of the peak. This provides the precise determination of the location of the surface along the z-axis relative to a reference coordinate.

A second algorithm, shown in FIGS. 8 and 9, also involves z-axis scanning, but determines the slopes of the curve of the detector output signal curve on either side of the peak and extrapolates the slopes to the peak signal and the associated focal position. Again, this provides precise definition of the susceptor surface along the z-axis.

The third algorithm uses scanning parallel to the investigated surface and uses the signal variation at the opposite edges of a depression (or elevation) to precisely locate the edges of that surface feature.

Finally, the present/absence of partially specularly reflected surfaces such as susceptors can be determined by scanning the sensor unit at the focal distance and monitoring the strength of the output detector signal.

Having thus described preferred and alternative embodiment of the invention, what is claimed is:

1. In a method of detecting essentially specularly reflecting and partially specularly reflecting, partially diffuse regions or components of a surface, the steps comprising:
   (1) mounting an infrared beam emitter having a focal length and an infrared beam detector having a focal length along respective output beam and input beam axes oriented at an angle of about 45°–90° therebetween and spaced apart a distance selected to provide coincident emitter and detector foci;
   (2) confining the output beam at the emitter and the input beam at the detector to relatively small diameters;
   (3) positioning the emitter and detector at different angles relative to the normal to the surface; and
   (4) scanning the positioned emitter and detector along the surface at the focal distance therefrom to provide reflected emitter beam intensity levels at the detector representative of at least one of (1) substantially purely specular reflection and partially specular reflection and (2) at least one of elevations and depressions in the partially specularly reflecting region or component of the surface.

2. The method of claim 1 wherein the emitter and detector beam diameters are approximately 5 mm.

3. The method of claim 1 wherein the angular difference between the orientation of the emitter and the detector is about 16°.

4. In a method of detecting the distance between a crossed optics pair sensor unit and a partially specularly reflecting surface, the steps comprising:
   (1) mounting an infrared beam emitter having a focal length and an infrared beam detector having a focal length along respective output beam and input beam axes oriented at an angle of about 45°–90° therebetween and spaced apart a distance selected to provide coincident emitter and detector foci;
   (2) confining the output beam at the emitter and the input beam at the detector to relatively small diameters;
   (3) positioning the emitter and detector at different angles relative to the normal to the surface; and
   (4) scanning the detector along an axis substantially perpendicular to the surface and through the focal distance of the unit to provide reflected emitter beam intensity levels at the detector representative of the distance between the detector and the surface along the perpendicular axis.

5. The method of claim 4 wherein the emitter and detector beam diameters are approximately 5 mm.

6. The method of claim 4 wherein the angular difference between the orientation of the emitter and the detector is about 16°.

7. A method of controlling the relative position of an object and a depressed or elevated feature in a partially specular reflecting, partially diffuse reflecting surface, along a direction generally parallel to the surface, using a sensor including a light beam emitter having a focal length and a light beam detector having a focal length, comprising:
   (A) positioning the sensor by mounting the light beam emitter and the light beam detector along respective output beam and input beam axes oriented with an angle of about 45°–90° therebetween and spaced apart a distance selected to provide substantially coincident emitter and detector foci, and orienting the emitter and detector at different angles relative to the normal to the surface;
   (B) scanning the positioned emitter and detector along the surface at the focal distance therefrom to provide reflected emitter beam intensity levels representative of spaced edges of the feature, and determining the position of the feature relative to the position of the sensor from said representative signals; and
   (C) using the position information to control the relative position of the object and the feature.

8. A method of controlling the position of an object along an axis transverse to a partially specular reflecting, partially diffuse reflecting surface using a sensor means including a light beam emitter for reflecting the light beam off said surface and a light beam detector means for providing an output signal representative of the reflected light intensity received at the light beam, the light beam emitter and the light beam detector means each having a focal length, comprising:
   (A) positioning the light beam emitter and the light beam detector means along respective output beam and input beam axes oriented with an angle of about 45°–90° therebetween and spaced apart a distance selected to provide coincident emitter and detector foci, positioning the light beam emitter and the light beam detector means at different angles relative to the normal to the surface, and mounting the object a known distance along the axis relative to the sensor means;
   (B) scanning the positioned sensor along the axis through the focal distance of the positioned sensor unit to provide equal valued output signals on opposite sides of said focal distance representative of the detector being spaced an equal distance from the focal distance, and determining the maximum side signals and using the focal distance to determine the associated distance between the object and the surface; and
   (C) using the associated distance information to control the position of the object relative to said surface.

9. A method of controlling the position of an object along an axis transverse to a partially specular reflecting, partially diffuse reflecting surface using a sensor means including a light beam emitter for reflecting the light beam off said surface and a light beam detector means for providing an output signal representative of the reflected light intensity received at the light beam detector means, the light beam emitter and the light beam detector means each having a focal length, comprising:
   (A) positioning the light beam emitter and the beam detector means along respective output beam and input beam axes oreinted with an angle of about 45°–90° therebetween and spaced apart a distance selected to provide coincident emitter and detector foci, positioning the light beam emitter and the light beam detector means at different angles relative to the normal to the surface, and mounting the object a known distance along the axis relative to the sensor means.

(B) determining the position of the object relative to the surface by scanning the positioned sensor means along the axis and through the focal distance of the positioned sensor unit to provide at least several output signals on opposite sides of said sensor focal distance representative of the distance between the detector means and the surface, determining the positive and negative slopes of the signal curve associated with the opposite side signals, extrapolating the two slopes to obtain the location of the maximum signal and associated focal distance, and using the focal distance to determine the associated distance between the object and the surface; and (C) using the associated distance information to control the position of the object relative to said surface.

* * * * *